US012717225B2

(12) United States Patent
Park et al.

(10) Patent No.: US 12,717,225 B2
(45) Date of Patent: Aug. 25, 2026

(54) PROCESS PROXIMITY EFFECT CORRECTION METHOD AND PROCESS PROXIMITY EFFECT CORRECTION DEVICE

(71) Applicant: Samsung Electronics Co., Ltd., Suwon-si (KR)

(72) Inventors: Dae Young Park, Suwon-si (KR); Jeong Hoon Ko, Suwon-si (KR); Seong Ryeol Kim, Suwon-si (KR); Young-Gu Kim, Suwon-si (KR); Tae Hoon Kim, Suwon-si (KR); Hyun Joong Kim, Suwon-si (KR); Young Ju Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 514 days.

(21) Appl. No.: 18/326,659

(22) Filed: May 31, 2023

(65) Prior Publication Data

US 2024/0085777 A1 Mar. 14, 2024

(30) Foreign Application Priority Data

Sep. 8, 2022 (KR) ........................ 10-2022-0114356

(51) Int. Cl.
*G03F 1/36* (2012.01)
*G03F 1/80* (2012.01)
(Continued)

(52) U.S. Cl.
CPC .................. *G03F 1/36* (2013.01); *G03F 1/80* (2013.01); *G03F 1/84* (2013.01); *G03F 7/70625* (2013.01);
(Continued)

(58) Field of Classification Search
CPC ..... G03F 1/36; G03F 1/80; G03F 1/84; G03F 7/70625; G03F 7/70683; G03F 7/706841;
(Continued)

(56) References Cited

U.S. PATENT DOCUMENTS 7,571,021 B2 8/2009 Lin et al.
9,069,926 B2 6/2015 Gupta et al.
(Continued)

FOREIGN PATENT DOCUMENTS

KR 10-2010-0001136 A 1/2010
KR 20210133364 A 11/2021
KR 20220001262 A 1/2022

OTHER PUBLICATIONS

Office Action issued Feb. 5, 2026 in Korean Application No. 10-2022-0114356.

*Primary Examiner* — Caleen O Sullivan
(74) *Attorney, Agent, or Firm* — Harness, Dickey & Pierce, P.L.C.

(57) ABSTRACT

Provided is a process proximity effect correction method capable of efficiently improving the dispersion of patterns. There is a process proximity effect correction method according to some embodiments, the process proximity effect correction method of a process proximity effect correction device for performing process proximity effect correction (PPC) of a plurality of patterns using a machine learning module executed by a processor, comprising: training a sensitivity model by inputting a layout image of the plurality of patterns and a layout critical dimension (CD) of the plurality of patterns into the machine learning module; estimating an after cleaning inspection critical dimension (ACI-CD) sensitivity prediction value of the plurality of patterns by inferring an ACI-CD prediction value of the plurality of patterns; and determining a correction rate of the
(Continued)

layout CD of the plurality of patterns using the estimated sensitivity prediction value.

20 Claims, 9 Drawing Sheets

(51) Int. Cl.
*G03F 1/84* (2012.01)
*G03F 7/00* (2006.01)

(52) U.S. Cl.
CPC .... *G03F 7/70683* (2013.01); *G03F 7/706841* (2023.05)

(58) Field of Classification Search
CPC .......... G03F 1/70; G06N 20/00; G06N 3/045; G06N 3/08
USPC ........................................................... 430/5
See application file for complete search history.

(56) References Cited

U.S. PATENT DOCUMENTS

| | | | | |
|---|---|---|---|---|
| 10,254,641 | B2 | 4/2019 | Mailfert et al. | |
| 10,386,726 | B2 | 8/2019 | Cao et al. | |
| 10,431,422 | B2 | 10/2019 | Fujimura et al. | |
| 10,691,864 | B2 | 6/2020 | Wang et al. | |
| 10,908,498 | B2 | 2/2021 | Kim et al. | |
| 11,170,148 | B2 | 11/2021 | Tsunoda et al. | |
| 2021/0157228 | A1 | 5/2021 | Sriraman et al. | |
| 2022/0035237 | A1 | 2/2022 | Lee et al. | |
| 2023/0324881 | A1* | 10/2023 | Lee .................... | G05B 19/4099 700/121 |

* cited by examiner

FIG. 2

$CD^{Layout}$ $IMG^{Layout}$

310

Deep

$CD^{Layout}$ $IMG^{Layout}$

Sensitivity Model

CNN

Normalized Feat

FC

FC

Scale

*

Bias

+

FC $PCD^{ACI}$

MSE loss $CD^{ACI}$

PROCESS PROXIMITY EFFECT CORRECTION METHOD AND PROCESS PROXIMITY EFFECT CORRECTION DEVICE

CROSS-REFERENCE TO RELATED APPLICATION

This application claims priority from Korean Patent Application No. 10-2022-0114356 filed on Sep. 8, 2022 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a process proximity effect correction method and a process proximity effect correction device.

2. Description of the Related Art

A semiconductor process of manufacturing a semiconductor device is conducted by a combination of various procedures such as etching, depositing, planation, growth, and implanting. The etching may be performed by forming a pattern of a photoresist on an object and removing portions of the object not covered by the photoresist using chemicals, gas, plasma, ion beams, and/or the like.

In the process of performing the etching, process errors may occur due to a variety of factors. These factors, which may yield process errors, may be caused by, e.g., the characteristics of the process, and of the photoresist pattern or the semiconductor pattern implemented by the etching. The process errors due to the characteristics of the pattern may be compensated by modifying or changing a layout of the patterns.

With the increase in demand for increased integration levels of semiconductor devices and the miniaturization of the semiconductor process, the number of patterns included in a semiconductor layout has rapidly increased. In addition, with the rapid increase of the amount of computation to modify or change the layout of patterns to compensate for the process errors, a process proximity effect correction (PPC) using machine learning is being used.

SUMMARY

Aspects of the present disclosure provide a process proximity effect correction method capable of efficiently improving the dispersion of patterns used in a semiconductor process.

Aspects of the present disclosure also provide a process proximity effect correction device capable of efficiently improving the distribution of patterns used in a semiconductor process.

The technical aspects of the present disclosure are not restricted to those set forth herein, and other unmentioned technical aspects will be clearly understood by one of ordinary skill in the art to which the present disclosure pertains by referencing the detailed description of the present disclosure given below.

Technical Solution

According to an aspect of the present disclosure, there is provided a process proximity effect correction (PPC) method according to some embodiments, the PPC method of a PPC device for performing PPC of a plurality of patterns including: training a sensitivity model by inputting a layout image of the plurality of patterns and a layout critical dimension (CD) of the plurality of patterns into a machine learning module; estimating an after cleaning inspection critical dimension (ACI-CD) sensitivity prediction value of the plurality of patterns by inferring an ACI-CD prediction value of the plurality of patterns using the trained sensitivity model; and determining a correction rate of the layout CD of the plurality of patterns using the ACI-CD sensitivity prediction value.

According to another aspect of the present disclosure, there is provided a process proximity effect correction (PPC) method according to some embodiments, the PPC method of a PPC device for performing PPC of a plurality of patterns using a processor, including: performing an etching process using a layout of the plurality of patterns; measuring data on an after cleaning inspection critical dimension (ACI-CD) of the etching process before correcting a layout critical dimension (CD); training a sensitivity model using the data; estimating an ACI-CD sensitivity prediction value using the sensitivity model; and determining a correction rate of the layout CD from the estimated sensitivity prediction value.

According to another aspect of the present disclosure, there is provided a process proximity effect correction (PPC_method according to some embodiments, the PPC method of a PPC device for performing PPC of a plurality of patterns using a processor, including: inferring an after cleaning inspection critical dimension (ACI-CD) prediction value before correcting a layout critical dimension (CD) by applying a first layout CD and a first layout image to a machine learning model; inferring the ACI-CD prediction value at the time of correcting the layout CD by applying a second layout CD, different from the first layout CD, and the first layout image to the machine learning model; estimating an ACI-CD sensitivity prediction value by using the ACI-CD prediction value at the time of correcting the layout CD and the ACI-CD prediction value before correcting the layout CD; and etching a pattern on a substrate based a layout corrected using the ACI-CD prediction value.

According to an aspect of the present disclosure, there is provided a process proximity effect correction (PPC) device according to some embodiments, which includes a plurality of processors. At least one of the plurality of processors performs process proximity effect correction of the plurality of patterns using a machine learning module. Performing the process proximity effect correction includes: training a sensitivity model by inputting a layout image of the plurality of patterns and a layout critical dimension (CD) of the plurality of patterns into a machine learning module; estimating an after cleaning inspection critical dimension (ACI-CD) sensitivity prediction value of the plurality of patterns by inferring ACI-CD prediction values of the plurality of patterns; and determining a correction rate of the layout CD of the plurality of patterns using the estimated sensitivity prediction value.

Specific details of other embodiments are included in the detailed description and the drawings.

BRIEF DESCRIPTION OF THE DRAWINGS

The above and other aspects and features of the present disclosure will become more apparent by describing in detail example embodiments thereof with reference to the attached drawings, in which:

FIG. 2 is an example diagram illustrating a method for obtaining an after cleaning inspection critical dimension (ACI-CD) prediction value through machine learning and estimating a sensitivity prediction value according to some embodiments;

FIGS. 3 and 4 are example diagrams illustrating a method for training a sensitivity model according to some embodiments;

DETAILED DESCRIPTION OF THE EMBODIMENT

Hereinafter, embodiments of the present disclosure will be described with reference to the attached drawings. In the description and in the accompanying drawings, like numerals refer to like elements throughout. Therefore, the repeated descriptions of like element may be omitted. Below, the term "and/or" is interpreted as including any one of items listed with regard to the term, or a combination of some of the listed items.

Figure 1:
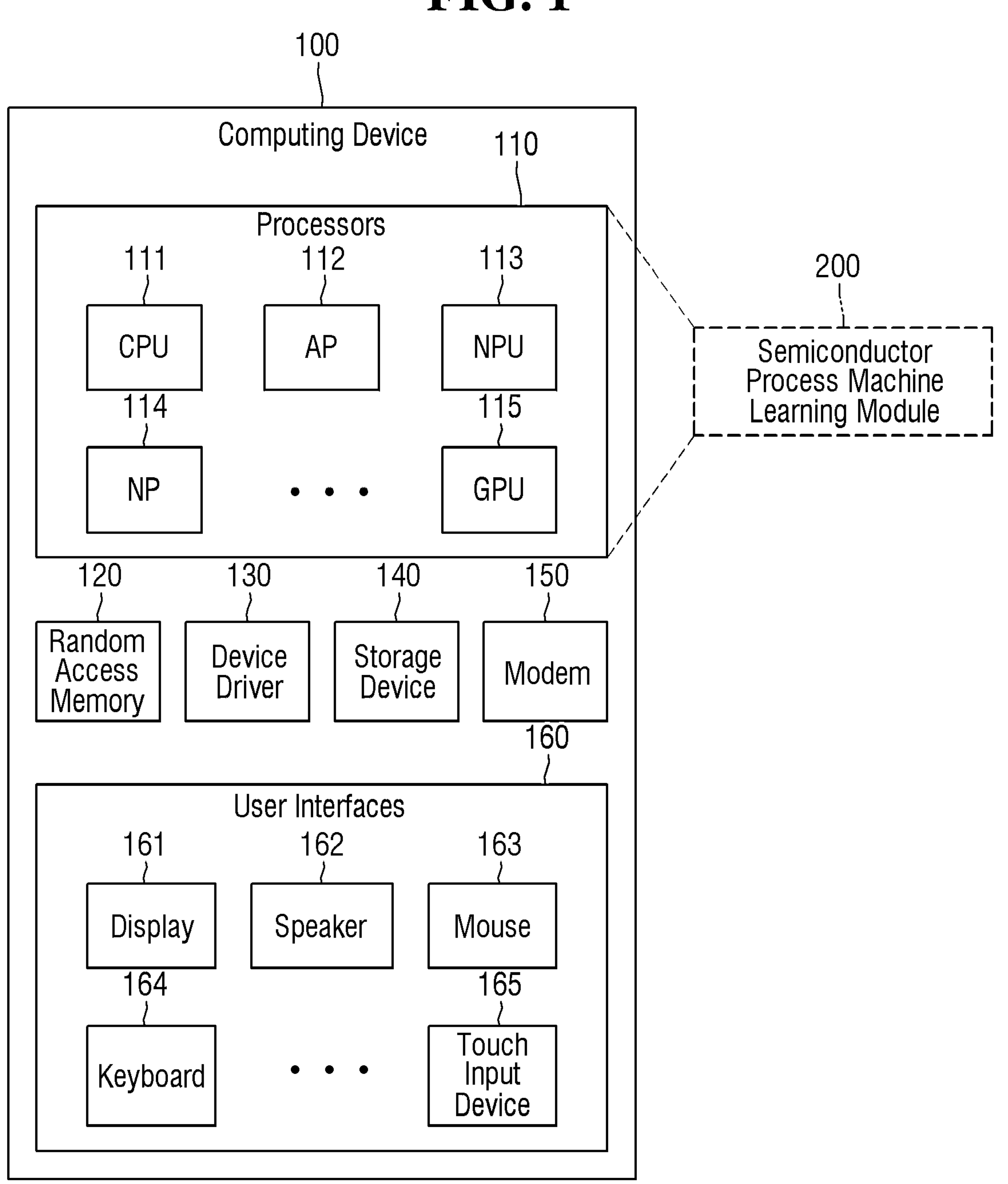
FIG. 1 is an example block diagram illustrating a process proximity effect correction (PPC) device according to some embodiments.

FIG. 1 is an example block diagram illustrating a process proximity effect correction device according to some embodiments.

Referring to FIG. 1, a computing device 100 according to some embodiments may include a plurality of processors 110, a random access memory 120, a device driver 130, a storage device 140, a modem 150, and user interfaces 160.

The processors 110 may include at least one general-purpose processor, such as a central processing unit (CPU) 111, an application processor (AP) 112, and/or the like. The processors 110 may also include at least one special purpose processor, such as a neural processing unit 113, a neuromorphic processor 114, a graphics processing unit (GPU) 115, and/or the like. The processors 110 may include two or more processors of the same type. Additionally, in at least some embodiments, the computing device 100 may include more or fewer processors 110 than illustrated.

At least one of the processors 110 may execute a semiconductor process machine learning module 200. For example, in at least some embodiments, the computing device 100 may include a general purpose processor configured to control the operations of the computing device 100 and a special process processor configured to execute the semiconductor process machine learning module 200. The semiconductor process machine learning module 200 may generate a layout for manufacturing a semiconductor device based on machine learning. For example, the semiconductor process machine learning module 200 may be implemented in the form of instructions (or codes) executed by at least one of the processors 110. In that case, at least one processor may load instructions (or codes) of the semiconductor process machine learning module 200 into the random access memory 120.

As another example, at least one processor may be manufactured to implement the semiconductor process machine learning module 200. As another example, the at least one processor may be manufactured to implement a variety of machine learning modules. The at least one processor may implement the semiconductor process machine learning module 200 by receiving information corresponding to the semiconductor process machine learning module 200.

As described in greater detail below, a layout for a semiconductor manufacturing process may be generated based on process proximity effect correction (PPC) through the semiconductor process machine learning module 200 executed by at least one of the plurality of processors 110 according to some embodiments.

The process proximity effect correction (PPC) according to some embodiments can predict information on an after cleaning image (ACI) state by a photo process (e.g., etching) for a target layout subject to the PPC. For example, through a process proximity effect correction (PPC), method according to some embodiments, it is possible to predict a critical dimension (CD), (e.g., a pattern line width and/or a spacing width), of a plurality of patterns depending on the ACI state of the target layout.

The random access memory 120 may be used as an operation memory of the processors 110 and/or as a main memory (and/or a system memory) of the computing device 100. The random access memory 120 may include a volatile memory such as a dynamic random access memory or a static random access memory, and/or a nonvolatile memory such as a phase change random access memory, a ferroelectric random access memory, a magnetic random access memory, or a resistive random access memory.

The device driver 130 may control peripheral devices such as the storage device 140, the modem 150, and the user interfaces 160 according to a request from the processors 110. The storage device 140 may include a fixed storage device such as a hard disk drive or a solid state drive, or a removable storage device such as an external hard disk drive, an external solid state drive or a removable memory card.

The storage device 140 may store images that are necessary for and/or utilized in the learning (or training) of the semiconductor process machine learning module 200. The images stored in the storage device 140 may be loaded onto the random access memory 120 and may be used for the learning (or training) of the semiconductor layout simulation module 200. The storage device 140 may include, for example, a non-volatile memory, and in at least one embodiment, may be detachable from the electronic device 200. Therefore, in at least some embodiments, the storage device 140 may be removed after the data contained therein is transferred to the main memory and/or after the semiconductor process machine learning module 200 is trained.

The modem 150 may provide remote communication with an external device and/or network. The modem 150 may perform wireless or wired communication with the external device and/or network. For example, the modem 150 may communicate via at least one of various communication types such as Ethernet, Wi-Fi, LTE, 5G mobile communication, etc.

The user interfaces 160 may receive information from a user and/or provide information to the user. The user interfaces 160 may include at least one user output interface such as a display 161, a speaker 162, and/or the like, and at least one user input interface such as a mouse 163, a keyboard 164, a touch input device 165, and/or the like. Additionally, in at least some embodiments, the computing device 100 may include more or fewer user interfaces 160 than illustrated.

The instructions (or codes) of the semiconductor process machine learning module 200 may be received via the modem 150 and stored in the storage device 140. The instructions (or codes) of the semiconductor process machine learning module 200 may be stored in a removable storage device (e.g., storage device 140) and coupled to the computing device 100. The instructions (or codes) of the semiconductor process machine learning module 200 may be loaded from the storage device 140 to the random access memory 120 and then executed.

At least one of the plurality of processors 110 according to some embodiments may generate the layout. For example, at least one of the plurality of processors 110 according to some embodiments may execute the semiconductor process machine learning module 200. Then, the semiconductor process machine learning module 200 according to some embodiments may generate the layout for manufacturing the semiconductor device based on the machine learning. More specifically, the semiconductor process machine learning module 200, according to some embodiments, may perform the PPC on the layout for manufacturing the semiconductor device and, in at least some embodiments, adjust the layout based on the PPC results.

The layout may be generated based on the PPC through the semiconductor process machine learning module 200 executed by at least one of the plurality of processors 110 according to some embodiments. In that case, the plurality of processors 110 according to some embodiments may perform the PPC via deep learning after converting the layout into an image.

First, at least one of the plurality of processors 110 according to some embodiments may convert the layout subject to the PPC into the image in order to perform the PPC.

In at least one of the plurality of processors 110 according to some embodiments, the target layout used to perform the PPC may be formed, for example, of vector data. In that case, when the target layout is converted into the image, vectors of the target layout may be generated as the image by converting the vectors into pixels.

Figure 2:
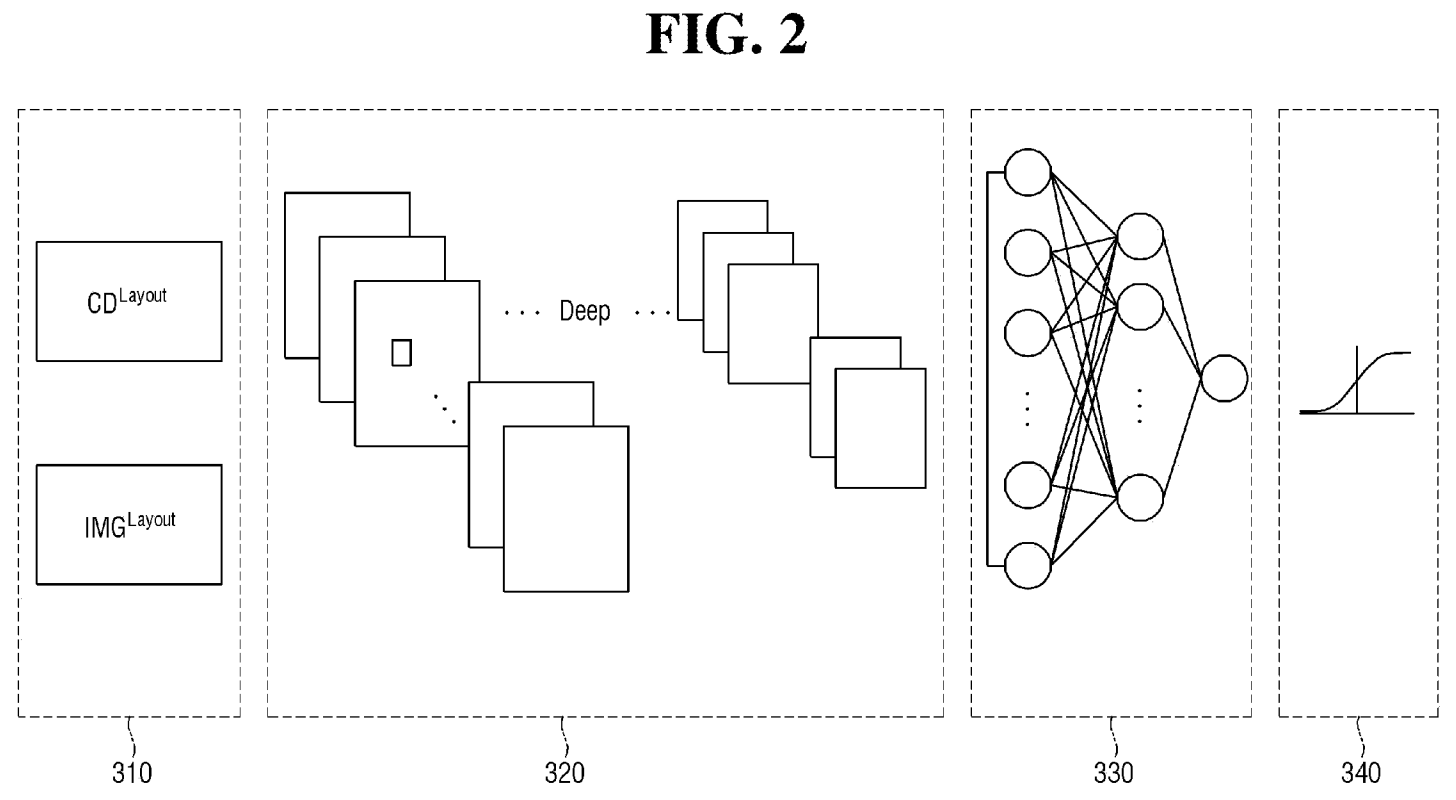

FIG. 2 is an example diagram illustrating a method for obtaining an after cleaning inspection critical dimension (ACI-CD) prediction value through machine learning and estimating a sensitivity prediction value according to some embodiments.

Referring to FIGS. 1 and 2, at least one of the plurality of processors 110 may predict an after cleaning image (ACI) based on a neural network.

Hereinafter, it will be described that at least one of a plurality of processors 110 according to some embodiments predicts the ACI via a convolutional neural network (CNN). However, at least one of the plurality of processors 110 according to some embodiments is not limited thereto. For example, the computing device 100 may, for example, have a structure that is trainable, e.g., with training data, such as an artificial neural network, a decision tree, a support vector machine, a Bayesian network, a genetic algorithm, and/or the like. Non-limiting examples of the trainable structure may include a convolution neural network (CNN), a generative adversarial network (GAN), an artificial neural network (ANN), a region based convolution neural network (R-CNN), a region proposal network (RPN), a recurrent neural network (RNN), a stacking-based deep neural network (S-DNN), a state-space dynamic neural network (S-SDNN), a deconvolution network, a deep belief network (DBN), a restricted Boltzmann machine (RBM), a fully convolutional network, a long short-term memory (LSTM) network, a classification network, and/or the like.

At least one of the plurality of processors 110, according to some embodiments, may receive a layout image ($IMG^{Layout}$) of the plurality of patterns and a layout CD ($CD^{Layout}$) of the plurality of patterns as information 310 on the plurality of patterns, as an input of the convolutional neural network 320.

At least one of the plurality of processors 110, according to some embodiments, may receive and input the information 310 to the convolutional neural network 320, and may predict the ACI using the input.

At least one of the plurality of processors 110, according to some embodiments, may receive and input the information 310 to the convolutional neural network 320, and train the convolutional neural network 320 (and/or the fully connected neural network 330) to predict the ACI using the input.

In at least some embodiments, the information 310 on the plurality of patterns may include, for example, at least one of the number of the plurality of patterns in the target layout, the area occupied by each of the plurality of patterns in the target layout, the density occupied by each of the plurality of patterns in the target layout, and/or the like. The information 310 on the plurality of patterns is not limited to the aforementioned information. Furthermore, the information 310 on the plurality of patterns may be a combination of the aforementioned information.

A plurality of convolution layers may be disposed in the convolution neural network 320 according to some embodiments. Although not illustrated, pooling layers may be disposed between the plurality of convolution layers.

Outputs generated via the convolutional neural network 320 according to some embodiments may be input into fully connected neural networks 330. The fully connected neural networks 330 may include a plurality of fully connected (FC) layers.

Through the fully connected neural networks 330, the predicted ACI may be calculated via a regression network 340, thereby generating a target layout. Since the operation performed via the regression network 340 will be explained in relation to FIG. 9 described below, a description thereof will be omitted in this section.

Figure 3:
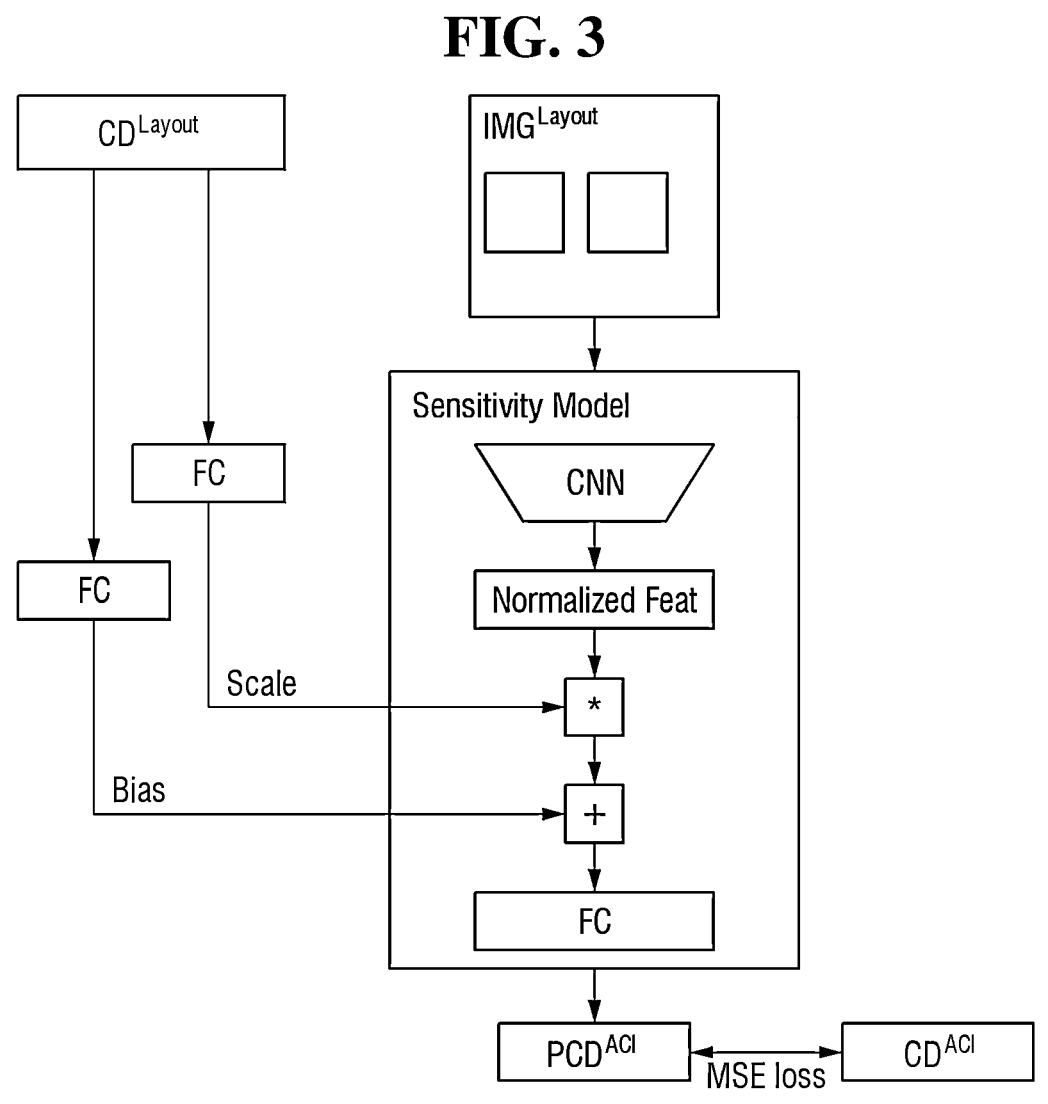
Figure 4:
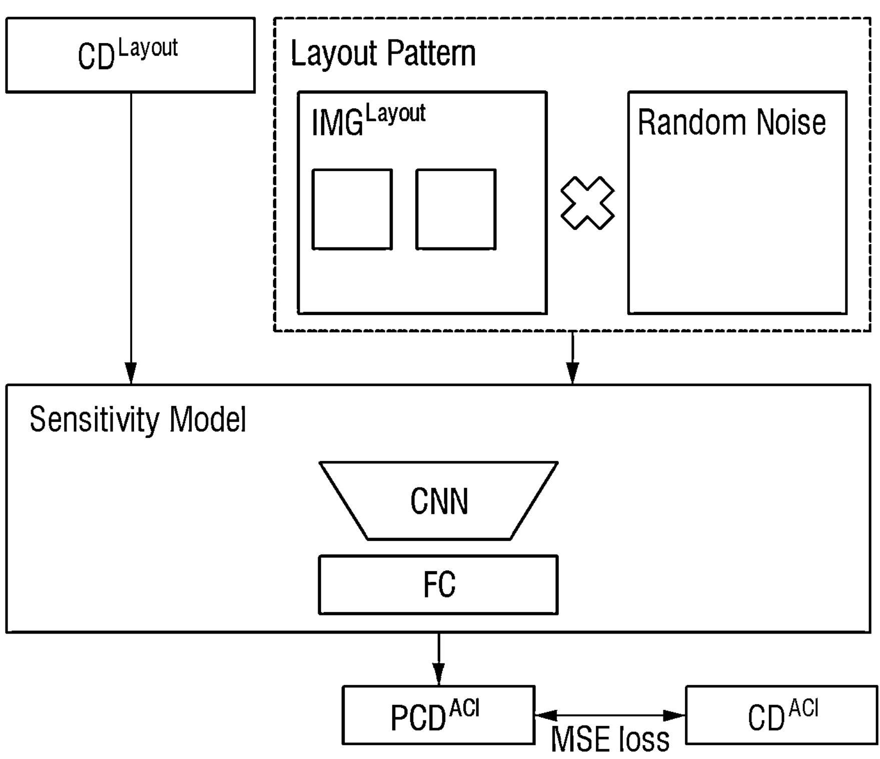

FIGS. 3 and 4 are example diagrams illustrating a method for training a sensitivity model according to some embodiments.

Referring to FIG. 3, the sensitivity model may be trained by inputting the layout image ($IMG^{Layout}$) of the plurality of patterns and the layout CD ($CD^{Layout}$) of the plurality of patterns into the semiconductor process machine learning module 200 of FIG. 1. In some embodiments, the layout image ($IMG^{Layout}$) may refer to a layout image cropped, e.g., to a Num*Num size, wherein Num represents, e.g., a preset (or otherwise determined) number of pixels and/or a value representing a physical measurement (e.g., in nanometers (nm)).

Training the sensitivity model may include generating a first output by performing normalization on a convolution operation result for the layout image ($IMG^{Layout}$) of the plurality of patterns. Then, a multiplication operation on the layout CD ($CD^{Layout}$) of the plurality of patterns may be performed, and an addition operation for the layout CD ($CD^{Layout}$) of the plurality of patterns may be performed. In other words, a scale and a bias may be learned using the layout CD ($CD^{Layout}$) of the plurality of patterns.

After inputting information on the layout CD ($CD^{Layout}$) of the plurality of patterns into first fully connected neural networks, the multiplication operation may be performed. After inputting the information on the layout CD (CD Layout) of the plurality of patterns into a second fully connected neural networks FC, the addition operation may be performed.

In addition, with regard to the first output, a second output generated through the multiplication operation and the addition operation may be input into third fully connected neural networks.

An ACI-CD prediction value ($PCD^{ACI}$) of the plurality of patterns may be obtained by the result generated via the third fully connected neural networks.

In order to reduce a difference between an ACI-CD measurement value ($CD^{ACI}$) of the plurality of patterns before correcting the layout CD ($CD^{Layout}$) and the ACI-CD prediction value ($PCD^{ACI}$) of the plurality of patterns predicted by the sensitivity model, a mean squared error (MSE) operation can be performed. According to a comparison result comparing these differences, the weight applied during the training of the sensitivity model may be modified (or varied).

Referring to FIG. 4, random noise may be used to prevent overfitting for a specific pattern. A layout image ($IMG^{Layout}$ Num*Num) of a pattern can be generated by multiplying the layout image ($IMG^{Layout}$ Num*Num) by a random noise value between 0.9 and 1.0 by pixel. In other words, the value of the layout image ($IMG^{Layout}$ Num*Num) can be randomly changed from 0 to 10% to train the sensitivity model so as to avoid overfitting for the specific pattern.

Figure 5:
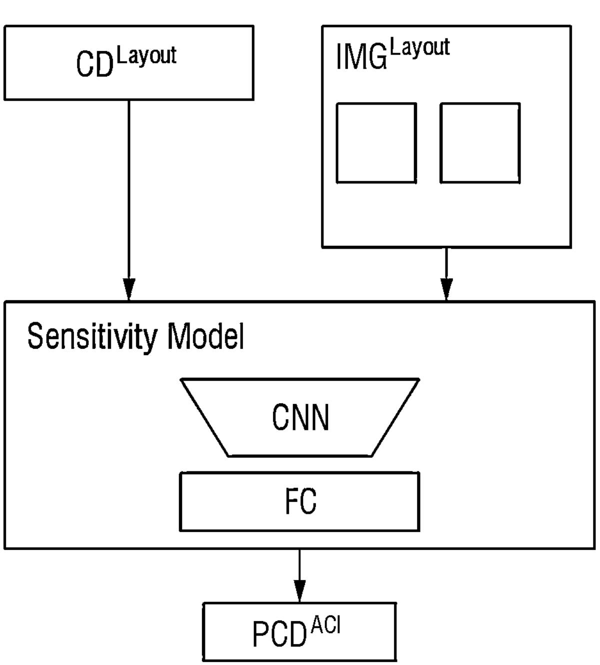
FIGS. 5 and 6 are example diagrams illustrating a method for inferring the ACI-CD prediction value before correcting a layout CD.
Figure 6:
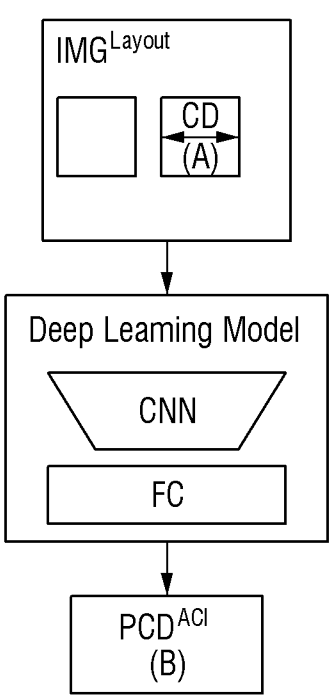

FIGS. 5 and 6 are example diagrams illustrating a method for inferring the ACI-CD prediction value before correcting the layout CD.

According to some embodiments, using, e.g., the sensitivity model trained in FIGS. 3 and 4, it is possible to infer the ACI-CD prediction value ($PCD^{ACI}$) of the plurality of patterns and estimate an ACI-CD sensitivity prediction value ($Esen_{CD}{}^{ACI}$) of the plurality of patterns. According to some embodiments, the ACI-CD prediction value may represent a predicted value for a critical dimension after cleaning, and the ACI-CD sensitivity prediction value may represent a tolerance value for the prediction value. According to at least some embodiments, when the ACI-CD sensitivity prediction value is greater than the ACI-CD prediction value may be used as an indicator that the layout is flawed.

Referring to FIG. 5, estimating the ACI-CD sensitivity prediction value ($Esen_{CD}{}^{ACI}$) of the plurality of patterns may include inferring the ACI-CD prediction value ($PCD^{ACI}$) of the plurality of patterns by applying the sensitivity model to the layout image ($IMG^{Layout}$) of the plurality of patterns before correction and the layout CD ($CD^{Layout}$) of the plurality of patterns before correction. For example, the sensitivity model may be (or include) a deep learning model.

In that case, the ACI-CD prediction value ($PCD^{ACI}$) before correcting the layout CD ($CD^{Layout}$) can be inferred by applying both the layout CD ($CD^{Layout}$) before correction and a first layout image ($IMG^{Layout}$) before correction to a machine learning model at the same time.

Referring to FIG. 6, for example, the layout CD ($CD^{Layout}$, A) of the plurality of patterns before correction may be 80 nm, and the ACI-CD prediction value ($PCD^{ACI}$, B) of the plurality of patterns may be 60 nm. However, the aforementioned numerical values are example, and the technical idea of the present disclosure is not limited thereto.

Figure 7:
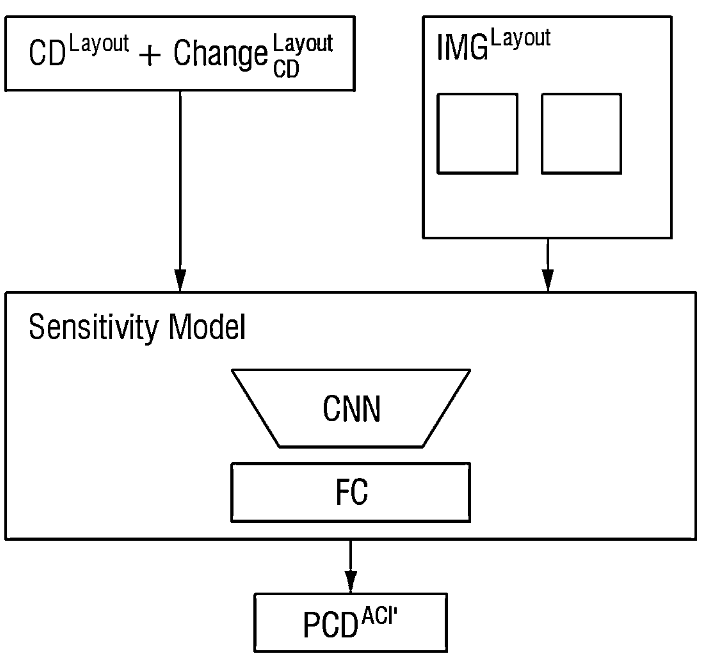
FIGS. 7 and 8 are example diagrams illustrating a method for inferring the ACI-CD prediction value at the time of correcting the layout CD.
Figure 8:
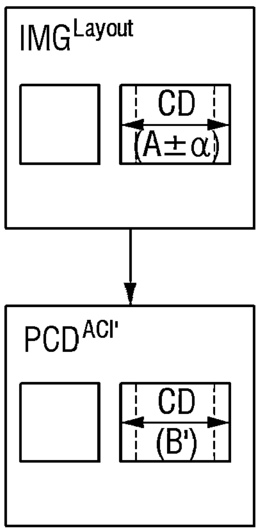

FIGS. 7 and 8 are example diagrams illustrating a method for inferring the ACI-CD prediction value at the time of correcting the layout CD.

Referring to FIG. 7, the ACI-CD prediction value ($PCD^{ACI}$) of the plurality of patterns at the time of correcting the layout CD can be inferred by applying the sensitivity model to the sum of the layout image ($IMG^{Layout}$) of the plurality of patterns before correction, the layout CD ($CD^{Layout}$) of the plurality of patterns and a layout CD correction amount ($Change_{CD}{}^{Layout}$) of the plurality of patterns.

In some embodiments, the sum of the layout CD ($CD^{Layout}$) of the plurality of patterns and the layout CD correction amount ($Change_{CD}{}^{Layout}$) of the plurality of patterns may be referred to as a layout CD change value of the plurality of patterns or a second layout CD.

The correction amount may mean a value arbitrarily input by a user on the outside. For example, it may mean a value of adding 1 nm to the layout CD ($CD^{Layout}$, 80 nm) before correction, but the present disclosure is not limited thereto.

In that case, the ACI-CD prediction value ($PCD^{ACI'}$) at the time of correcting the layout CD ($CD^{Layout}$) can be inferred by applying the layout image ($IMG^{Layout}$) before correction and the second layout CD where the layout CD correction amount ($Change_{CD}{}^{Layout}$) of the plurality of patterns is added to the layout CD ($CD^{Layout}$) before correction, to the machine learning model. In other words, the second layout CD with a value different from that of the layout CD ($CD^{Layout}$) before correction may be input into the machine learning model.

Referring to FIG. 8, for example, the layout CD change value ($CD^{Layout}$+$Change_{CD}{}^{Layout}$, A±α) of the plurality of patterns may be 80 nm±12.5 nm, and the ACI-CD prediction value ($PC^{ACI'}$, B') at the time of correcting the layout CD of the plurality of patterns may be 65 nm.

However, the aforementioned numerical values are example, and the technical idea of the present disclosure is not limited thereto.

The ACI-CD sensitivity prediction value ($Esen_{CD}{}^{ACI}$) of the plurality of patterns can be estimated by using the difference between the ACI-CD prediction value ($PCD^{ACI'}$) at the time of correcting the layout CD of the plurality of the patterns and the ACI-CD prediction value ($PCD^{ACI}$) of the plurality of patterns (e.g., before the correction).

The ACI-CD sensitivity prediction value (Esen Dc ACI) of the plurality of patterns may be calculated using Equations 1 and 2. For example, the ACI-CD sensitivity prediction value ($Esen_{CD}{}^{ACI}$) of the plurality of patterns can be calculated by the difference ($Change_{PCD}{}^{ACI}$) between the ACI-CD prediction value ($PCD^{ACI'}$, 65 nm) at the time of correcting the layout CD of the plurality of patterns and the ACI-CD prediction value ($PCD^{ACI}$, 60 nm) of the plurality of patterns with respect to the difference ($Change_{CD}{}^{Layout}$) between the layout CD change value ($CD^{Layout}$+$Change_{CD}{}^{Layout}$, 80 nm+12.5 nm) of the plurality of patterns and the layout CD ($CD^{Layout}$, 80 nm) of the plurality of patterns before correction.

$$Change_{PCD}{}^{ACI} == PCD^{ACI'} - PCD^{ACI} \text{ value} \quad \text{Equation 1}$$

$$Esen_{CD}{}^{ACI} = Change_{CD}{}^{Layout} / Change_{PCD}{}^{ACI} \quad \text{Equation 2}$$

Figure 9:
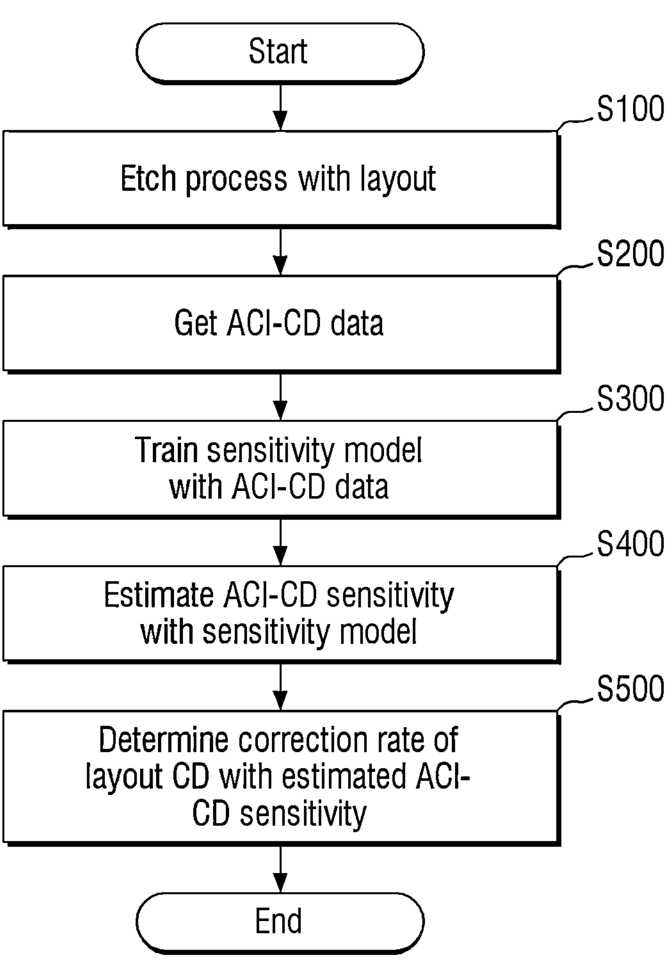
FIG. 9 is a flowchart schematically illustrating a process proximity effect correction method according to some embodiments.

FIG. 9 is a flowchart schematically illustrating a process proximity effect correction method according to some embodiments.

Referring to FIG. 9, the etching process may be performed using the layout of the plurality of patterns (S100). Then, data on the ACI-CD before correcting the layout CD ($CD^{Layout}$) may be measured (S200). After that, the sensitivity model may be trained using the data (S300), and after the etching process, the ACI-CD prediction value ($PCD^{ACI}$) of the plurality of patterns can be obtained.

Then, the ACI-CD sensitivity prediction value ($Esen_{CD}^{ACI}$) may be estimated using the sensitivity model (S400), and a correction rate of the layout CD ($CD^{Layout}$) may be determined from the estimated sensitivity prediction value ($Esen_{CD}^{ACI}$) (S500).

According to some embodiments, determining the correction rate of the lay out CD ($CD^{Layout}$) may include, adjusting the distance between, width of, and/or shape of features and elements in the layout. According to some embodiments, the etch process (S100) may be through the determining correction rate (S500) may be repeated, such that the results of the estimate (S400) are confirmed to match a real-world example (e.g., the ACI-DC measurement value discussed above) and/or the sensitivity model is retrained based on the differences between the estimate and the real world example.

Additionally, according to some embodiments, after training the sensitivity model may be used to confirm and/or deny potential layouts. For example, the trained sensitivity model may be applied in a control module for a semiconductor processing apparatus, such that the approve or reject an input layout. For example, when the control module approves the layout, based on the results of the sensitivity model, the control module may direct the semiconductor processing apparatus and a semiconductor with the layout may be produced; and/or when the control module rejects the layout, the control module may direct the semiconductor processing apparatus to pause production and/or may provide corrections to the layout and produce the semiconductor based on the corrected layout. According to some embodiments, the control model may further provide (or display) the characteristic yielding the process error, and may provide for the correction of and retesting of a layout based on an inputted correction or modification.

According to some embodiments, even if the measured layout CD data do not exist after correcting the layout CD, the correction rate of the layout CD may be determined by estimating the sensitivity of the ACI-CD. Accordingly, even if semiconductor processes (such as etching) are not performed multiple times, the dispersion of patterns can be efficiently reduced in patterns with different ACI-CD change rates compared to the layout CD.

Obtaining the correction rate may include obtaining sensitivity data according to the layout CD ($CD^{Layout}$) of the plurality of patterns and selecting a median value of the sensitivity data for each layout CD ($CD^{Layout}$), thus removing noise. To predict the sensitivity of the layout CD ($CD^{Layout}$) not included in the training data, noise can be removed by selecting the median values for each layout CD ($CD^{Layout}$).

In the case of the sensitivity data generated according to some embodiments, since the noise of the output value is removed in this way, the distribution of the sensitivity data may be reduced as compared to the related art.

Then, the tendency between the layout CD ($CD^{Layout}$) of the plurality of patterns from which the noise is removed and the sensitivity data can be analyzed using a non-linear regression model, such as a spline regression model, which for example, fit non-linear data to combinations (or blends) of linear and polynomial functions. After that, the ACI-CD sensitivity prediction value ($Esen_{CD}^{ACI}$) of the plurality of patterns can be estimated for each size of the layout CD ($CD^{Layout}$) of the plurality of patterns to determine the correction rate of the layout CD ($CD^{Layout}$) of the plurality of patterns.

For example, as discussed above, the correction rate can be determined by adding a value of multiplying the sensitivity prediction value ($Esen_{CD}^{ACI}$, 0.4) calculated using the aforementioned equations by the layout CD correction amount ($Change_{CD}^{Layout}$, 12.5 nm) of the plurality of patterns, to the ACI-CD prediction value ($PCD^{ACI}$, 60 nm) of the plurality of patterns. According to some embodiments, since the correction rate may be determined using the sensitivity model described above, errors in the semiconductor process may be reduced as compared to the related art. Meanwhile, the aforementioned numerical values are example, and the technical idea of the present disclosure is not limited thereto.

As will be appreciated by one skilled in the art, the example embodiments in this disclosure may be embodied as a system, method, computer program product, and/or a computer program product embodied in one or more computer readable medium(s) having computer readable program code embodied thereon. The computer readable program code may be provided to a processor of a general purpose computer, special purpose computer, and/or other programmable data processing apparatus. The computer readable medium may be a computer readable signal medium and/or a computer readable storage medium. The computer readable storage medium may be any tangible medium that can contain, and/or store a program for use by or in connection with an instruction execution system, apparatus, or device.

In this disclosure, the functional blocks denoting elements that process (and/or perform) at least one function or operation and may be included in and/or implemented as processing circuitry such hardware, software, or the combination of hardware and software. For example, the processing circuitry more specifically may include (and/or be included in), but is not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, application-specific integrated circuit (ASIC), semiconductor elements in an integrated circuit, circuits enrolled as an intellectual property (IP), etc. For example, the term "module" may refer to a software component and/or a hardware component such as a field programmable gate array (FPGA) or an application specific integrated circuit (ASIC), and/or combination of a hardware component and a software component. However, a "module" is not limited to software or hardware. A "module" may be configured to be included in an addressable storage medium or to reproduce one or more processors. Accordingly, for example, a "module" may include components such as software components, object-oriented software components, class components, and task components, processes. functions, attributes, procedures, subroutines, segments of program code, drivers, firmware, microcode, circuits, data, databases, data structures, tables, arrays, and variables. A function provided in components or modules may be integrated with a smaller number of components and/or divided into additional components.

The example embodiments may be applied to designing and manufacturing any electronic devices and systems. For example, the inventive concepts may be applied to systems such as a memory card, a solid state drive (SSD), an embedded multimedia card (eMMC), a universal flash storage (UFS), a mobile phone, a smart phone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, a server system, an automotive driving system, etc.

Although the embodiments of the present disclosure have been described above with reference to the accompanying drawings, the present disclosure is not limited to the disclosed embodiments, but may be implemented in various different ways, and the present disclosure may be embodied in many different forms without changing technical subject matters and essential features as will be understood by those skilled in the art. Therefore, embodiments set forth herein are example only and not to be construed as a limitation.

What is claimed is:

1. A process proximity effect correction (PPC) method of a PPC device for performing PPC of a plurality of patterns, the method comprising:

training a sensitivity model by inputting a layout image of the plurality of patterns and a layout critical dimension (CD) of the plurality of patterns into a machine learning module;

estimating an after cleaning inspection critical dimension (ACI-CD) sensitivity prediction value of the plurality of patterns by inferring an ACI-CD prediction value of the plurality of patterns using the trained sensitivity model; and determining a correction rate of the layout CD of the plurality of patterns using the ACI-CD sensitivity prediction value.

2. The process proximity effect correction method of claim 1, wherein the training the sensitivity model comprises:

generating a first output by performing normalization on a convolution operation result on the layout image of the plurality of patterns;

performing a scaling operation on the layout CD of the plurality of patterns; and performing a bias operation on the layout CD of the plurality of patterns.

3. The process proximity effect correction method of claim 2, wherein the scaling operation is performed after information on the layout CD of the plurality of patterns is input into first fully connected neural networks, and the bias operation is performed after information on the layout CD of the plurality of patterns is input into second fully connected neural networks.

4. The process proximity effect correction method of claim 2, further comprising:

inputting a second output generated through the scaling operation and the bias operation into third fully connected neural networks.

5. The process proximity effect correction method of claim 2, wherein the training the sensitivity model further comprises:

performing a mean squared error (MSE) operation to reduce a difference between an ACI-CD measurement value of the plurality of patterns and the ACI-CD prediction value of the plurality of patterns.

6. The process proximity effect correction method of claim 1, wherein the estimating the ACI-CD sensitivity prediction value of the plurality of patterns comprises:

inferring the ACI-CD prediction value of the plurality of patterns by applying the sensitivity model to the layout image of the plurality of patterns before correction and to the layout CD of the plurality of patterns before correction.

7. The process proximity effect correction method of claim 6, further comprising:

inferring the ACI-CD prediction value at a time while correcting the layout CD of the plurality of patterns by applying the sensitivity model to the layout image of the plurality of patterns before correction and to a layout CD change value of the plurality of patterns.

8. The process proximity effect correction method of claim 7, further comprising:

estimating the ACI-CD sensitivity prediction value of the plurality of patterns by using a difference between the ACI-CD prediction value at the time of correcting the layout CD of the plurality of patterns and the ACI-CD prediction value of the plurality of patterns before correction.

9. The process proximity effect correction method of claim 7, wherein the ACI-CD sensitivity prediction value of the plurality of patterns is determined based on a difference between the ACI-CD prediction value at the time of correcting the layout CD of the plurality of patterns and the ACI-CD prediction value before correction, and the ACI-CD prediction value of the plurality of patterns is determined based on a difference between the layout CD change value of the plurality of patterns and the layout CD of the plurality of patterns before correction.

10. The process proximity effect correction method of claim 1, wherein the ACI-CD sensitivity prediction value of the plurality of patterns is estimated for each size of the layout CD of the plurality of patterns to determine the correction rate of the layout CD of the plurality of patterns.

11. A process proximity effect correction (PPC) method of a PPC correction device for performing PPC of a plurality of patterns using a processor, the method comprising:

performing an etching process using a layout of the plurality of patterns;

measuring data on an after cleaning inspection critical dimension (ACI-CD) of the etching process before correcting a layout critical dimension (CD);

training a sensitivity model using the data;

estimating an ACI-CD sensitivity prediction value using the sensitivity model; and determining a correction rate of the layout CD from the estimated ACI-CD sensitivity prediction value.

12. The process proximity effect correction method of claim 11, wherein the training the sensitivity model comprises:

performing normalization on a convolution operation result for a layout image of the plurality of patterns;

performing a first operation on the layout CD; and performing a second operation on the layout CD.

13. The process proximity effect correction method of claim 12, wherein the first operation is performed after inputting information on the layout CD into first fully connected neural networks, and the second operation is performed after inputting the information on the layout CD into second fully connected neural networks.

14. The process proximity effect correction method of claim 11, wherein the estimating the ACI-CD sensitivity prediction value comprises:

inferring an ACI-CD prediction value before correcting the layout CD by applying a first layout CD and a first layout image to the sensitivity model;

inferring the ACI-CD prediction value at a time while correcting the layout CD by applying a second layout CD where a correction amount is added to the first layout CD and the first layout image to the sensitivity model; and estimating the ACI-CD sensitivity prediction value by using the ACI-CD prediction value at the time of correcting the layout CD and the ACI-CD prediction value before correcting the layout CD.

15. The process proximity effect correction method of claim 14, wherein the ACI-CD sensitivity prediction value is calculated based on a difference between the ACI-CD prediction value at the time while correcting the layout CD for the correction amount and the ACI-CD prediction value before correcting the layout CD.

16. The process proximity effect correction method of claim 15, wherein the ACI-CD sensitivity prediction value is estimated for each size of the layout CD.

17. A process proximity effect correction (PPC) method of a PPC device for performing PPC of a plurality of patterns using a processor, the method comprises:

inferring an after cleaning inspection critical dimension (ACI-CD) prediction value before correcting a layout critical dimension (CD) by applying a first layout CD and a first layout image to a machine learning model;

inferring the ACI-CD prediction value at a time while correcting the layout CD by applying a second layout CD, different from the first layout CD, and the first layout image to the machine learning model;

estimating an ACI-CD sensitivity prediction value using the ACI-CD prediction value at the time of correcting the layout CD and the ACI-CD prediction value before correcting the layout CD; and etching a pattern on a substrate based a layout corrected using the ACI-CD prediction value.

18. The process proximity effect correction method of claim 17, wherein the ACI-CD sensitivity prediction value is calculated based on a difference between the ACI-CD prediction value at the time of correcting the layout CD and the ACI-CD prediction value before correcting the layout CD.

19. The process proximity effect correction method of claim 17, wherein the machine learning model includes a deep learning model.

20. The process proximity effect correction method of claim 17, wherein the ACI-CD sensitivity prediction value is estimated using a spline regression model; and a correction rate of the layout CD is determined from the estimated ACI-CD sensitivity prediction value.

* * * * *